(12) United States Patent
Takada et al.

(10) Patent No.: US 9,609,745 B2
(45) Date of Patent: Mar. 28, 2017

(54) TRANSPARENT CONDUCTIVE FILM

(71) Applicant: NITTO DENKO CORPORATION, Ibaraki, Osaka (JP)

(72) Inventors: Katsunori Takada, Ibaraki (JP); Kazuhiro Ikai, Ibaraki (JP); Hiroki Kuramoto, Ibaraki (JP); Hiroyuki Takao, Ibaraki (JP); Naoki Tsuno, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 13/709,280

(22) Filed: Dec. 10, 2012

(65) Prior Publication Data
US 2013/0157010 A1    Jun. 20, 2013

(30) Foreign Application Priority Data

Dec. 16, 2011   (JP) .................................. 2011-276019
Oct. 2, 2012    (JP) .................................. 2012-220239

(51) Int. Cl.
*H05K 1/02*     (2006.01)
*H01B 1/08*     (2006.01)

(52) U.S. Cl.
CPC ............ *H05K 1/0298* (2013.01); *H01B 1/08* (2013.01); *Y10T 428/24372* (2015.01); *Y10T 428/24405* (2015.01); *Y10T 428/24421* (2015.01)

(58) Field of Classification Search
CPC ......... H05K 1/0298; H01B 1/08; H01B 3/006
USPC ................................ 428/141, 143, 147, 149
See application file for complete search history.

(56) References Cited

U.S. PATENT DOCUMENTS

| | | | |
|---|---|---|---|
| 7,390,099 B2* | 6/2008 | Takao et al. ................. | 359/601 |
| 7,569,269 B2* | 8/2009 | Takada et al. ............... | 428/323 |
| 8,062,731 B2* | 11/2011 | Takada et al. ............... | 428/145 |
| 2003/0008135 A1* | 1/2003 | Kawamura et al. ......... | 428/336 |

(Continued)

FOREIGN PATENT DOCUMENTS

| CN | 1509231 A | 6/2004 |
|---|---|---|
| CN | 101263564 A | 9/2008 |

(Continued)

OTHER PUBLICATIONS

Korean Office Action dated Dec. 24, 2013, issued in corresponding Korean application No. 10-2012-0146264, w/ English translation (8 pages).
Korean Decision of Refusal dated Jun. 2, 2014, issued in corresponding Korean Patent Application No. 10-2012-0146264, w/English translation (8 pages).
Korean Office Action dated Aug. 1, 2014, issued in corresponding KR applicaton No. 10-2012-0146264 with English translation (10 pages).

(Continued)

*Primary Examiner* — Nathan Van Sell
(74) *Attorney, Agent, or Firm* — Westerman, Hattori, Daniels & Adrian, LLP

(57) ABSTRACT

A transparent conductive film includes a film base, a cured resin layer formed at one side of the film base, and an indium composite oxide layer laminated at a side of the cured resin layer opposite to the film base. The indium composite oxide layer has a thickness of 20 nm to 50 nm. The cured resin layer has a plurality of spherical particles and a binder resin layer which fixes the plurality of spherical particles to the film base. A difference w−d between a mode particle size w and a thickness d of the binder resin layer is greater than zero and less than or equal to 1.2 μm, where w is a mode particle size of the spherical particles and d is a thickness of the binder resin layer.

8 Claims, 4 Drawing Sheets

(56) References Cited

U.S. PATENT DOCUMENTS

| | | | |
|---|---|---|---|
| 2004/0112175 A1* | 6/2004 | Ishihara et al. | 75/255 |
| 2004/0151895 A1 | 8/2004 | Itoh et al. | |
| 2006/0132922 A1* | 6/2006 | Takao et al. | 359/601 |
| 2006/0134400 A1* | 6/2006 | Takada et al. | 428/313.9 |
| 2006/0181774 A1* | 8/2006 | Ojima et al. | 359/586 |
| 2007/0184260 A1 | 8/2007 | Saito et al. | |
| 2007/0217014 A1* | 9/2007 | Fukushige | 359/582 |
| 2009/0016209 A1* | 1/2009 | Ikeda et al. | 369/284 |
| 2009/0086326 A1* | 4/2009 | Hamamoto et al. | 359/601 |
| 2009/0284475 A1 | 11/2009 | Nashiki et al. | |
| 2009/0315849 A1 | 12/2009 | Ito | |
| 2011/0151215 A1* | 6/2011 | Kobayashi | 428/212 |
| 2011/0287173 A1* | 11/2011 | Takada et al. | 427/108 |
| 2012/0092290 A1 | 4/2012 | Itoh et al. | |
| 2013/0157010 A1 | 6/2013 | Takada et al. | |

FOREIGN PATENT DOCUMENTS

| | | |
|---|---|---|
| CN | 101465173 A | 6/2009 |
| CN | 101634918 A | 1/2010 |
| CN | 203232707 U | 10/2013 |
| JP | H10-323931 A | 12/1998 |
| JP | 2000-301648 A | 10/2000 |
| JP | 2001-35261 A | 2/2001 |
| JP | 2003-249124 A | 9/2003 |
| JP | 2005-262442 A | 9/2005 |
| JP | 2007-103348 | 4/2007 |
| JP | 2007-230208 A | 9/2007 |
| JP | 2010-228401 A | 10/2010 |
| KR | 10-2008-0021148 A | 4/2010 |
| WO | 2008/088059 A1 | 7/2008 |
| WO | 2010/113970 A1 | 10/2010 |

OTHER PUBLICATIONS

Taiwanese Office Action dated Sep. 15, 2014, issued in corresponding Taiwanese Patent Application No. 101145320, w/English translation (10 pages).

Decision of Refusal dated Jun. 26, 2015, issued in Korean Patent Application No. 10-2012-0146264, with English translation. (9 pages).

Approval Decision dated Jun. 17, 2015, issued in corresponding Taiwanese patent application No. 101145320, (w/English translation) (5 pages).

Office Action dated Jan. 4, 2016, issued in counterpart Korean Patent Application No. 10-2015-0012656, with English translation. (11 pages).

Office Action dated Dec. 2, 2015, issued in counterpart Chinese Application No. 201210539648.7, with English translation (15 pages).

Office Action dated May 23, 2016, issued in counterpart Japanese Patent Application No. 2012-220239, with English translation. (7 pages).

Office Action dated Aug. 2, 2016, issued in counterpart Chinese Patent Application No. 201210539648.7, with English translation. (6 pages).

Decision to Grant a Patent dated Aug. 8, 2016, issued in counterpart Japanese Patent Application No. 2012-220239, with English translation. (6 pages).

Decision to Grant a Patent dated Aug. 24, 2016, issued in counterpart Korean Patent Application No. 10-2015-0012656, with English translation. (3 pages).

Decision to Grant dated Dec. 2, 2016, issued in counterpart Chinese Application No. 201210539648.7, with English translation. (2 pages).

* cited by examiner

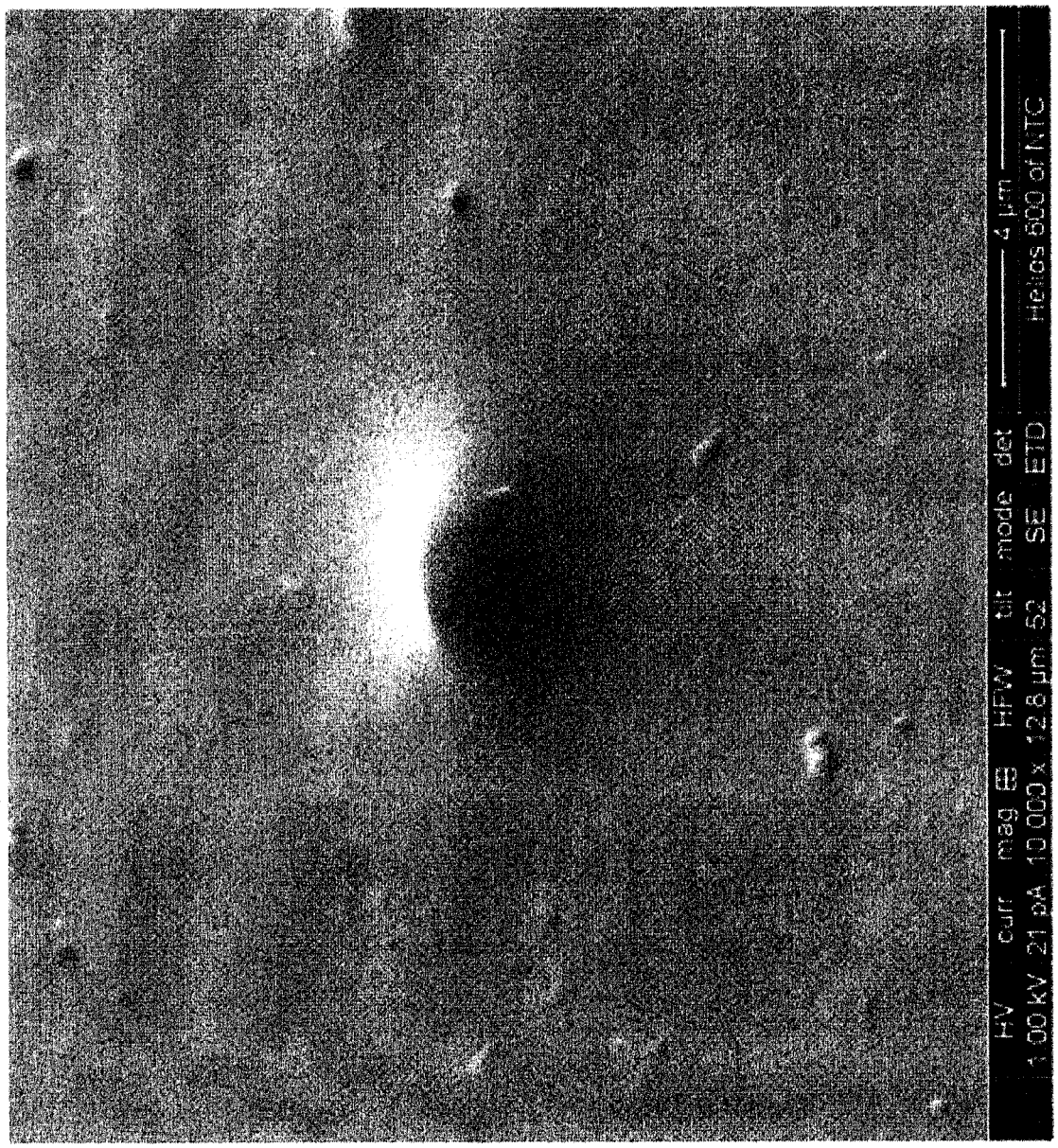
F I G. 5

TRANSPARENT CONDUCTIVE FILM

CROSS REFERENCE TO RELATED APPLICATIONS

This application claims the benefit of Japanese Application Nos. 2011-276019 and 2012-220239, filed Dec. 16, 2011 and Oct. 2, 2012, respectively, which are hereby incorporated by reference herein in their entirety.

BACKGROUND OF INVENTION

Field of the Invention

The present invention relates to a transparent conductive film applicable to an input display unit capable of inputting information by a touch of a finger, a stylus pen, or the like.

Background of the Invention

In the related art, a transparent conductive film is known in which an indium tin oxide layer is laminated on a film base on which a cured resin layer (hardcoat layer) containing spherical particles is formed and a mode particle size of the spherical particles is several tens of nanometers (nm) (Japanese Laid-open Patent Publication (Kolai) No. 2007-230208). With such a transparent conductive film, it is possible to prevent a surface of the film base from being damaged and, in a resistive-type touch sensor, it is possible to reduce a rainbow colored push trace (also referred to as Newton's rings) that occur when pressed with a finger.

However, with the transparent conductive film of the related art, there is a problem that a haze (Haze) increases to about 5.8% to 9.0% and the transparency decreases which causes a decrease in a display quality. Particularly, in the case of a touch sensor of a capacitive sensing type, since it is required to decrease haze from a display quality point of view, it is difficult to employ the aforementioned transparent conductive film without changes.

SUMMARY OF INVENTION

It is an object of the invention to provide a transparent conductive film having a reduced haze and an improved quality.

To achieve the above object, in an aspect of the present invention, there is provided a transparent conductive film of the present invention including a film base, a first cured resin layer formed at one side of the film base, and a first indium composite oxide layer laminated at a side of the first cured resin layer opposite to the film base, wherein the first indium composite oxide layer has a thickness of 20 nm to 50 nm, the first cured resin layer has a plurality of spherical particles and a first binder resin layer which fixes the plurality of spherical particles to the film base, and a difference w−d between a mode particle size w and a thickness d of the first binder resin layer is greater than zero and less than or equal to 1.2 µm, where w is a mode particle size of the spherical particles and d is a thickness of the first binder resin layer.

Preferably, the difference w−d is 0.1 µm to 1.0 µm, and the mode particle size w is 0.5 µm to 3.0 µm.

More preferably, the difference w−d is 0.3 µm to 0.9 µm, and the mode particle size w is 1.0 µm to 2.0 µm.

Preferably, the first cured resin layer contains 0.1 parts by weight to 4.0 parts by weight of the plurality of spherical particles with respect to 100 parts by weight of a binder resin composing the first binder resin layer.

Preferably, the spherical particle is made of a material selected from a group consisting of an acrylic polymer, a silicone polymer, a styrene polymer and an inorganic silica.

Preferably, the first binder resin layer is made of a binder resin containing a multifunctional acrylate polymer and a polymer obtained by addition reaction of an acrylic acid to a glycidyl acrylate polymer.

Preferably, the film base has a thickness of 10 µm to 200 µm.

Preferably, the transparent conductive film further includes a second cured resin layer formed at another side of the film base, and a second indium composite oxide layer laminated at a side of the second cured resin layer opposite to the film base, wherein the second cured resin layer has a plurality of spherical particles and a second binder resin layer that fixes the plurality of spherical particles to the film base.

In accordance with the present invention, since the difference w−d between the mode particle size w of the spherical particles and the thickness d of the binder resin layer is greater than zero and less than or equal to 1.2 µm, the number of spherical particles buried in the binder resin layer is reduced and the spherical particles do not break through the indium composite oxide layer. Therefore, it is possible to provide a transparent conductive film having a reduced haze and an improved quality.

Further features of the present invention will become apparent from the following detailed description of exemplary embodiments with reference to the attached drawings.

BRIEF DESCRIPTION OF DRAWINGS

FIG. 5 is an electron micrograph of a surface of the transparent conductive film of Example 1.

DETAILED DESCRIPTION

Hereinafter, an embodiment of the present invention will be described in detail with reference to the accompanying drawings.

Figure 1:
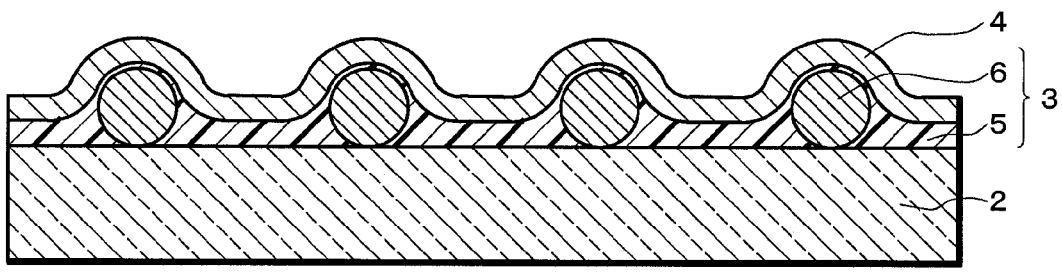
FIG. 1 is a cross-sectional view schematically showing a configuration of a transparent conductive film according to an embodiment of the present invention.

FIG. 1 is a cross-sectional view schematically showing a configuration of a transparent conductive film of the present embodiment. Note that, the thickness of each layer in FIG. 1 is shown by way of example, and the thickness of each layer in the film sensor of the present invention is not limited the thickness shown in FIG. 1.

As shown in FIG. 1, a transparent conductive film 1 of the present invention includes a film base 2, a cured resin layer 3 formed at one side of the film base, and an indium composite oxide layer 4 formed at a side of the cured resin layer 3 opposite to the film base 2. The cured resin layer 3 has a plurality of spherical particles 6 and a binder resin layer 5 that fixes the spherical particles to a surface of film base 2.

Figure 2:
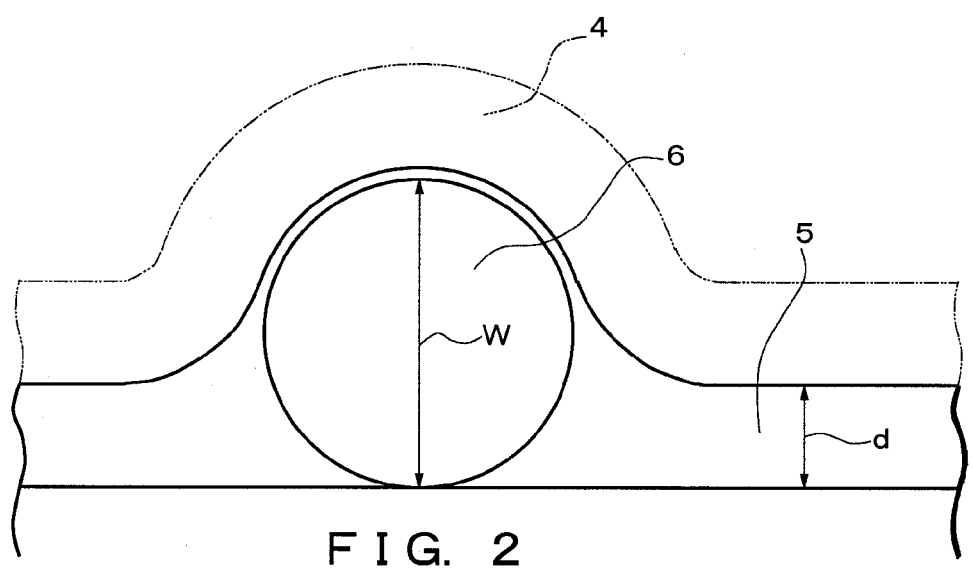
FIG. 2 is a partially enlarged view showing a configuration of a cured resin layer in FIG. 1.

The film base 2 has a thickness of 10 µm to 200 µm and the indium composite oxide layer 4 has a thickness of 20 nm to 50 nm. Also, as shown in FIG. 2, the cured resin layer 3 is configured in such a manner that a difference w−d between a mode particle size w and a thickness d of the binder resin layer 5 is greater than zero and less than or equal to 1.2 µm (0<w−d<1.2 µm), where w is the mode particle size of the spherical particles 6 and d is the thickness of the binder resin layer 5.

At an outer surface of the cured resin layer 3, in other words, at a surface on a side which is not in contact with the film base 2, a portion where the spherical particle 6 exists is convex and protrudes approximately by a size of the difference w−d and a portion where the spherical particle 6 does not exist is generally planar. Also, as shown in FIG. 2, a part of the binder resin layer is thinly formed at an upper surface of each of the spherical particles.

The indium composite oxide layer 4 has a surface profile similar to that of the cured resin layer 3, since it is laminated on the cured resin layer 3 having the above-mentioned surface profile with an extremely small thickness of 20 nm to 50 nm. With the transparent conductive film of the present invention, by providing a cured resin layer containing specific spherical particles as described above, it is possible to reduce haze and to improve quality.

Note that, the transparent conductive film of the present invention may include, between the film base 2 and the binder resin layer 5, a thin layer having a thickness of several nanometers (nm) to several tens of nanometers (nm) such as an anchor coat layer for improving an adhesiveness of the indium composite oxide layer or a refractive index adjustment layer (index matching layer) for adjusting reflectivity, as long as an effect of the invention is not impaired.

Next, details of each constituent element of the transparent conductive film 1 will be described below.

(1) Film Base

The film base used in the present invention is preferably a film base having an improved transparency. A material forming the film base is preferably polyethylene terephthalate, polycycloolefin or polycarbonate.

(2) Cured Resin Layer

The present inventors carried out assiduous studies to attain the above object, and as a result, focused on a relationship between a diameter of a plurality of spherical particles constituting the cured resin layer and a thickness of the binder resin layer fixing the spherical particles. The inventors have reached the findings that a film with reduced haze and improved quality can be provided when a relationship in which the difference w−d is greater than zero and less than or equal to 1.2 µm, where a mode particle size of the spherical particles is w and the thickness of the binder resin layer is d, is satisfied. Herein, the "mode particle size" means a particle diameter indicating a maximum of a particle size distribution and the "thickness of the binder resin layer" means a thickness of the flat portion where the spherical particle does not exist.

Due to an improved sphericity and heat resistance, a material forming the spherical particle is, preferably, a material which is selected from a group consisting of an acrylic polymer, a silicone polymer, a styrene polymer and an inorganic silica.

In such a cured material resin layer, the difference w−d between mode particle size w of the spherical particles and the thickness d of the binder resin layer is preferably 0.1 µm to 1.0 µm, and more preferably, 0.3 µm to 0.9 µm. The mode particle size w of the spherical particles is preferably 0.5 µm to 3.0 µm, and more preferably, 1.0 µm to 2.0 µm.

The transparent conductive film of the present invention can further reduce haze in comparison to a film of the related art by setting the aforementioned difference w−d and w to such ranges. Also, in a case of a roll body in which an elongated transparent conductive film is wound, there is a further effect that overlapping parts are not bonded.

On the other hand, when the difference w−d largely exceeds 1.2 µm, there will be an increase in the spherical particles which are not sufficiently fixed to the binder resin layer and the spherical particles will break through the indium composite oxide layer (the indium composite oxide layer will crack), and the quality may be remarkably reduced. This phenomenon becomes significant when the transparent conductive film is heat treated to obtain a transparent conductive film having a small surface resistivity. Also, when the difference w−d is less than zero by a large amount (w becomes smaller than d), the spherical particles buried in the binder resin layer increase, and the haze of the transparent conductive film, particularly an inside haze, may increase.

Any material can be selected as a material of a binder resin used for the binder resin layer, as long as the spherical particles can be fixed. For example, the binder resin is obtained by curing a curable resin composition by an ultraviolet radiation or an electron beam. The curable resin composition preferably contains a binder resin containing a multifunctional acrylate polymer such as pentaerythritol and dipentaerythritol, a polymer obtained by addition reaction of an acrylic acid to a glycidyl acrylate polymer, and a polymeric initiator.

The thickness d of the binder resin layer is smaller than the mode particle size w of the spherical particles, which is preferably 0.1 µm to 2.0 µm, and more preferably, 0.5 µm to 1.5 µm. With the thickness d being set at such a value, the spherical particle can be sufficiently fixed to the film base, and further, even if a microscopic flaw exists in the film base, a recess of the flaw can be filled with the binder resin. Therefore, a transparent conductive film having a higher quality can be obtained.

In order to obtain a transparent conductive film having a reduced haze, the cured resin layer preferably contains 200 to 7,000 spherical particles, and more preferably contains 300 to 5,000 spherical particles, per 1 $mm^2$ of the cured resin layer. Such a cured resin layer can be obtained by, for example, applying, on the film base, a spherical particle-containing curable resin composition that contains 0.1 parts by weight to 4.0 parts by weight of spherical particles with respect to 100 parts by weight of the curable resin composition (binder resin) and curing it by irradiating an ultraviolet radiation on the surface.

(3) Indium Composite Oxide Layer

The indium composite oxide layer used in the present invention is typically an indium tin composite oxide or an indium zinc composite oxide, and other than these layers, an indium oxide ($In_2O_3$) doped with metallic ions (IV) or metallic ions (II) may be used. Such an indium composite oxide layer has a transmissivity in the visible light range (380 nm to 780 nm) is high, which is 80% or higher, and a surface resistance value per unit area (50Ω/□: ohms per square) is low.

The surface resistance value of the indium composite oxide layer is preferably less than or equal to 300Ω/□, and more preferably, less than or equal to 270Ω/□. Such a transparent conductive film having a small surface resistance value can be obtained by, for example, forming an amorphous layer of the indium composite oxide on a cured resin layer by a sputtering method or a vacuum evaporation method, and thereafter applying a heat treatment of 120° C. to 200° C. to change the amorphous layer into a crystalline layer.

As set forth above, according to the present embodiment, since the difference w−d between the mode particle size w of the spherical particles 6 and the thickness d of the binder resin layer 5 is greater than zero and less than or equal to 1.2 µm, the number of spherical particles 6 buried in the binder resin layer 5 is reduced and also the spherical particles 6 do not break through the indium composite oxide layer. Therefore, it is possible to provide a transparent conductive film 1 with reduced haze and improved quality.

Also, according to another embodiment, the transparent conductive film of the present invention may be configured in such a manner that a cured material resin layer and an indium composite oxide layer similar to those formed on one side of the film base are also laminated on the other side of the film base.

Figure 3:
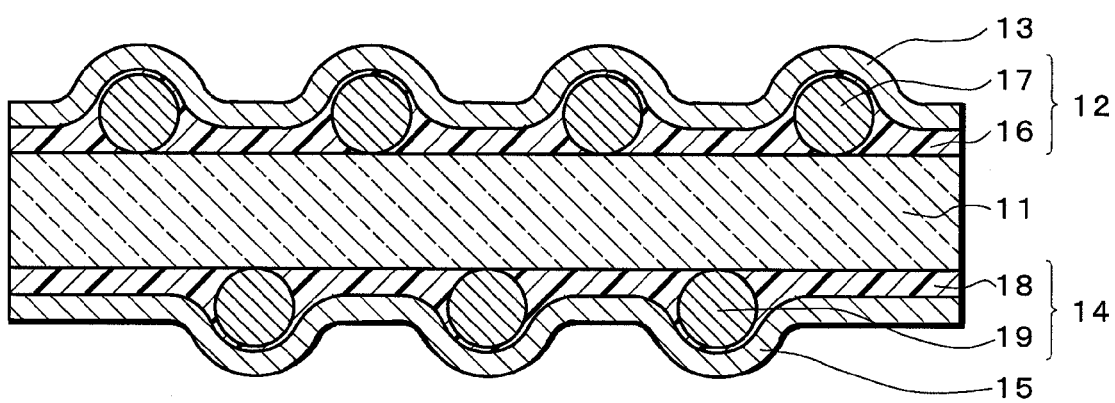
FIG. 3 is a cross-sectional view schematically showing a configuration of a transparent conductive film according to another embodiment of the present invention.

FIG. 3 is a cross-sectional view schematically illustrating the configuration of the transparent conductive film of another embodiment of the present invention.

A transparent conductive film 10 includes a film base 11, a cured resin layer (first cured resin layer) 12 formed at one side of the film base, an indium composite oxide layer 13 (first indium composite oxide layer) formed on the cured resin layer 12, a cured resin layer (second cured resin layer) 14 formed at the other side of the film base 11, and an indium composite oxide layer 15 (second indium composite oxide layer) formed on the cured resin layer 14. The cured resin layer 12 has a plurality of spherical particles (first spherical particles) 17 and a binder resin layer (first binder resin layer) 16 that fixes the spherical particles to one of the surfaces of film base 11. Similarly, the cured resin layer 14 has a plurality of spherical particles (second spherical particles) 19 and a binder resin layer (second binder resin layer) 18 that fixes the spherical particles to the other surface of the film base 11.

According to such a configuration, the number of spherical particles 17, 19 buried in the binder resin layers 16, 18 is reduced for both of the cured resin layers 12, 14, and also the spherical particles 17, 19 will not break through the indium composite oxide layers 13, 15. Therefore, it is possible to provide a transparent conductive film 10 with reduced haze and improved quality.

In the foregoing, although the transparent conductive film of the present embodiment has been described, the present invention is not limited to the embodiment described above, and various alteration and modification are conceivable based on the technical concept of the present invention.

Examples of the present invention will now be described.

EXAMPLES

Example 1

A cured resin layer having a thickness of 1.0 µm was formed by applying a spherical particle-containing curable resin composition that contains 100 parts by weight of an ultraviolet-curable resin composition (manufactured by DIC Corporation, product name: "UNIDIC (registered trademark) RS29-120") and 0.2 parts by weight of acrylic spherical particles (manufactured by Soken Chemical & Engineering Co., Ltd., product name: "MX-180TA") having a mode particle size of 1.9 µm to one of the faces of a polycycloolefin film (manufactured by Zeon Corporation, product name: "ZEONOR (registered trademark)" having a thickness of 100 µm and by irradiating an ultraviolet radiation on the surface. This cured resin layer contains 402 spherical particles per 1.0 mm².

Next, the polycycloolefin film on which the cured resin layer was formed was input into a sputtering device and an amorphous layer of indium tin oxide having a thickness of 27 mm was formed on the surface of the cured resin layer. Thereafter, the polyolefin film on which an amorphous layer of indium tin oxide was formed was heat-treated with a heating oven at 140° C. for 90 minutes, and a transparent conductive film having a surface resistance value of 270Ω/☐ was manufactured. Characteristics of this transparent conductive film are shown in Table 1.

Example 2

A transparent conductive film containing 4,769 spherical particles per 1.0 mm² of cured resin layer was manufactured in a manner similar to Example 1, except that styrene-based spherical particles (manufactured by Soken Chemical & Engineering Corporation, product name: "SX-130H") having a mode particle size of 1.3 µm was used. Characteristics of this transparent conductive film are shown in Table 1.

Example 3

A transparent conductive film containing 3,179 spherical particles per 1.0 mm² of cured resin layer was manufactured in a manner similar to Example 1 except that acrylic spherical particles (manufactured by Sekisui Plastics Co., Ltd., product name: "XX184AA") having a mode particle size of 1.5 µm was used and a composition was 0.3 parts by weight with respect to 100 parts by weight of the ultraviolet-curable resin composition. Characteristics of this transparent conductive film are shown in Table 1.

Comparative Example 1

A transparent conductive film containing 63 spherical particles per 1.0 mm² of cured resin layer was manufactured in a manner similar to Example 1 except that acrylic spherical particles (manufactured by Sekisui Plastics Co., Ltd., product name: "XX133AA") having a mode particle size of 3.0 µm was used and a composition was 0.08 parts by weight with respect to 100 parts by weight of the ultraviolet-curable resin composition. Characteristics of this transparent conductive film are shown in Table 1.

Comparative Example 2

A transparent conductive film containing 137 spherical particles per 1.0 mm² of cured resin layer was manufactured in a manner similar to Example 1 except that inorganic silica-based spherical particles (manufactured by Nippon Shokubai Co., Ltd., product name: "Seahostar (registered trademark) KEP-250") having a mode particle size of 2.5 µm was used and a composition was 0.4 parts by weight with respect to 100 parts by weight of the ultraviolet-curable resin composition. Characteristics of this transparent conductive film are shown in Table 1.

Comparative Example 3

A transparent conductive film containing 22,800 spherical particles per 1.0 mm² of the cured resin layer was manufactured in a manner similar to Example 1 except that acrylic spherical particles (manufactured by Sekisui Plastics Co., Ltd., product name: "BMSA") having a mode particle size of 0.8 µm was used and a composition was 2.0 parts by weight with respect to 100 parts by weight of the ultraviolet-curable resin composition. Characteristics of this transparent conductive film are shown in Table 1.

Next, Examples 1 to 3 and Comparative examples 1 to 3 were measured with the following measuring methods.

(1) Measurement of Thickness

A thickness of less than 1.0 µm was measured by observing a cross section of the transparent conductive film using a transmission electron microscope (manufactured by Hitachi, Ltd., product name: "H-7650"). The thickness of the film base was measured using a membrane pressure meter (manufactured by Ozaki MFG. Co., Ltd., Peacock digital dial gauge DG-205).

(2) Measurement of Mode Particle Size

Measurement was made under a predetermined condition (Sheath liquid: ethylacetate; measurement mode: HPF measurement mode; measuring method: total count) using a flow-type particle image analyzing device (manufactured by Sysmex Corporation, product name: "FPTA-3000S"). The sample used was the spherical particles diluted with ethylacetate to 1.0% by weight and uniformly dispersed using an ultrasonic cleaning machine.

(3) Measurement of the Number of Spherical Particles

For a transparent conductive film having a mode particle size w greater than a thickness d of the binder resin, measurement was carried out by measuring a three dimensional surface profile using an optical profilometer (manufactured by Veeco Instruments Inc., product name: "Optical Profilometer NT3300") with a 20× lens. Specifically, the number of spherical particles contained per 1.0 mm² was calculated based on the number of spherical particles in a 217 µm×286 µm field of view.

For a transparent conductive film having a mode particle size w less than a thickness d of the binder resin, measurement was made by transmission observation using an optical microscope (manufactured by Olympus Corporation, product name: "MX61L"). Specifically, the number of spherical particles contained per 1.0 mm² was calculated based on the number of spherical particles in a 50 µm×50 µm field of view.

(4) Measurement of Haze

The total haze was measured using a direct reading haze computer (manufactured by Suga Test Instruments Co., Ltd., product name: "HGM-ZDP"). Regarding an internal haze, by attaching an acrylic adhesive-backed transparent film having a refractive index of 1.47 to a surface of the indium tin compound oxide layer and filling an irregularity on the surface of the indium tin compound oxide layer with an acrylic adhesive, a sample with a reduced influence of haze due to the irregularity can be created and the haze of this sample was measured with the direct reading haze computer (manufactured by Suga Test Instruments Co., Ltd., product name: "HGM-ZDP").

Note that, a "total haze" is a value obtained in conformity with JIS K7105. Also, an "internal haze" is a value obtained by subtracting a surface haze caused by a surface profile of the indium composite oxide layer from the total haze and, for example, occurs due to a refractive index difference between the spherical particles and the binder resin.

(5) Verification of Crack in Indium Composite Oxide Layer

Using a scanning electron microscope (manufactured by "FEI" Company, product name: "Helios NanoLab 600"), the cross section and the surface of the transparent conductive film were observed and confirmed. The crack means a crack in the indium composite oxide layer produced by the spherical particle breaking through the indium composite oxide layer.

(6) Measurement of the Surface Resistance Value

Measurement was made by four point probe method in conformity with JIS K7194.

Results obtained by evaluating with the aforementioned evaluation methods (1) to (6) are shown in Table 1.

TABLE 1

|  | w (µm) | d (µm) | w − d (µm) | HAZE (%) TOTAL | HAZE (%) INTERNAL | CRACK | DETERMINATION |
|---|---|---|---|---|---|---|---|
| COMPARATIVE EXAMPLE 1 | 3 | 1 | 2 | 0.6 | 0.2 | YES | X (NG) |
| COMPARATIVE EXAMPLE 2 | 2.5 | 1 | 1.5 | 1.1 | 0.3 | YES | X (NG) |
| EXAMPLE 1 | 1.9 | 1 | 0.9 | 1.2 | 0.2 | NO | ○ (OK) |
| EXAMPLE 2 | 1.3 | 1 | 0.3 | 1 | 0.2 | NO | ○ (OK) |
| EXAMPLE 3 | 1.5 | 1 | 0.5 | 1.2 | 0.2 | NO | ○ (OK) |
| COMPARATIVE EXAMPLE 3 | 0.8 | 1 | −0.2 | 1.5 | 0.6 | NO | X (NG) |

Figure 4:
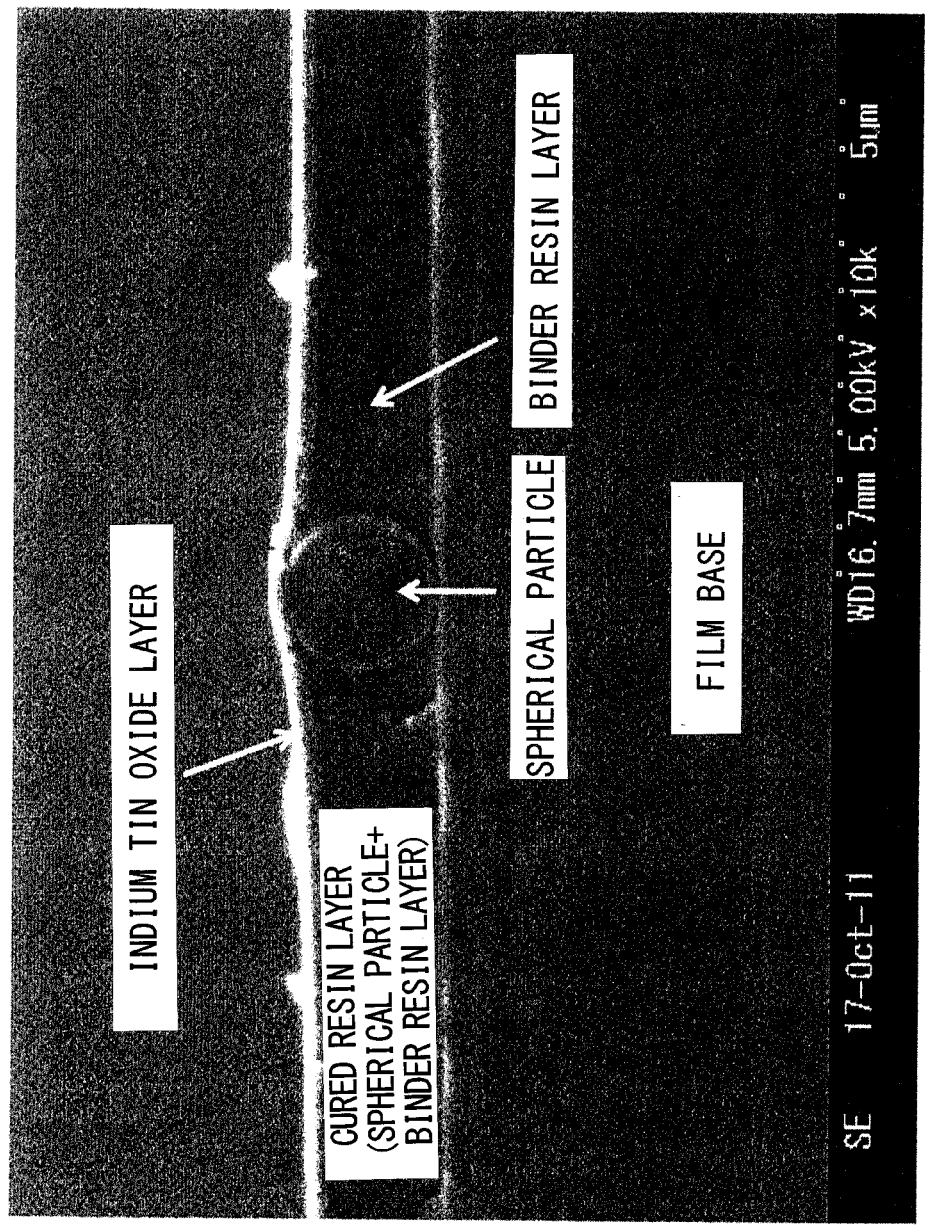
FIG. 4 is an electron micrograph of a cross section of the transparent conductive film of Example 1.

As shown in Examples 1, 2 and 3 in Table 1, when the difference w−d between the mode particle size w of the spherical particles and the thickness d of the binder layer was 0.3 µm to 0.9 µm, the total haze was 1.0% to 1.2% and the internal haze was 0.2%, and, the total haze and the internal haze both showed significantly small values. No crack in the indium tin system oxide layer due to the spherical particle was observed (FIG. 4, FIG. 5).

Figure 6:
FIG. 6 is an electron micrograph of a surface of the transparent conductive film of Comparative examples.

On the other hand, when the difference w−d was 1.5 µm or 2.0 µm, as shown in Comparative examples 1 and 2, a crack in the indium tin system oxide layer due to the spherical particle was observed (FIG. 6). In Comparative example 3, with difference w−d being −0.2 µm, although no crack in the indium tin system oxide layer due to the spherical particle was observed, the total haze was 1.5% and the internal haze was 0.6%, and the transparency was insufficient.

Therefore, with the configuration of the transparent conductive film of the present invention, when the difference w−d between the mode particle size w of the spherical particles and the thickness d of the binder layer was greater than zero and less than or equal to 1.2 µm, and specifically, 0.3 µm to 0.9 µm, it was found that a transparent conductive film having a reduced total haze and internal haze and an improved display quality can be provided.

INDUSTRIAL APPLICABILITY

There is no particular limitations to the applications of the transparent conductive film of the present invention, and preferably applied to a capacitive touch sensor used for portable terminal devices such as a smartphone or a tablet terminal device (also referred to as a Slate PC).

What is claimed is:

1. A transparent conductive film comprising:
a film base, a first cured resin layer formed on one side of the film base, and a first indium composite oxide layer laminated on a side of the first cured resin layer opposite to the film base,
wherein the first indium composite oxide layer is a crystalline layer, and has a thickness of 20 nm to 50 nm and a surface resistance value of less than or equal to 300Ω/□,
the first cured resin layer has a plurality of spherical particles and a first binder resin layer which fixes the plurality of spherical particles to the film base, the first cured resin layer having an irregularity on a surface of the first cured resin layer opposite to the film base, and
a difference w−d between a mode particle size w and a thickness d of the first binder resin layer is greater than zero and less than or equal to 1.2 μm, where w is a mode particle size of the spherical particles and d is a thickness of a flat portion of the first binder resin layer where the spherical particles do not exist.

2. The transparent conductive film according to claim 1, wherein the difference w−d is 0.1 μm to 1.0 μm, and the mode particle size w is 0.5 μm to 3.0 μm.

3. The transparent conductive film according to claim 2, wherein the difference w−d is 0.3 μm to 0.9 μm and the mode particle size w is 1.0 μm to 2.0 μm.

4. The transparent conductive film according to claim 1, wherein the first cured resin layer contains 0.1 parts by weight to 4.0 parts by weight of the plurality of spherical particles with respect to 100 parts by weight of a binder resin composing the first binder resin layer.

5. The transparent conductive film according to claim 1, wherein the spherical particle is made of a material selected from a group consisting of an acrylic polymer, a silicone polymer, a styrene polymer and an inorganic silica.

6. The transparent conductive film according to claim 1, wherein the first binder resin layer is made of a binder resin containing a multifunctional acrylate polymer and a polymer obtained by addition reaction of an acrylic acid to a glycidyl acrylate polymer.

7. The transparent conductive film according to claim 1, wherein the film base has a thickness of 10 μm to 200 μm.

8. The transparent conductive film according to claim 1, further comprising a second cured resin layer formed on another side of the film base, and a second indium composite oxide layer laminated on a side of the second cured resin layer opposite to the film base,
wherein the second cured resin layer has a plurality of spherical particles and a second binder resin layer that fixes the plurality of spherical particles to the film base and the second cured resin layer having an irregularity on a surface of the second cured resin layer opposite to the film base.

* * * * *